United States Patent [19]

Griffiths et al.

[11] Patent Number: 4,937,037
[45] Date of Patent: Jun. 26, 1990

[54] COMBINED INFORAMTION RECORDING AND GRAPHIC DISPLAY DEVICE

[75] Inventors: Christopher A. Griffiths; James Griffiths, both of Helston, United Kingdom

[73] Assignee: Christopher A. Griffiths, Cornwall, United Kingdom

[21] Appl. No.: 188,121

[22] Filed: Apr. 25, 1988

Related U.S. Application Data

[63] Continuation of Ser. No. 763,043, Aug. 6, 1985, abandoned.

[51] Int. Cl.[5] .............................................. G09G 1/06
[52] U.S. Cl. ...................................... 340/722; 340/753; 340/754; 324/115; 324/121 R
[58] Field of Search .......... 340/712, 753, 754, 288 M, 340/722, 784, 805, 718, 719, 731; 455/181; 350/333, 331 R; 324/115, 121 R; 364/518

[56] References Cited

U.S. PATENT DOCUMENTS

| | | | |
|---|---|---|---|
| 3,754,121 | 8/1973 | Delay et al. | 340/753 |
| 3,772,874 | 11/1973 | Lefkowitz | 340/753 |
| 3,789,387 | 1/1974 | Hurst | 340/815.31 |
| 4,127,848 | 11/1978 | Shanks | 340/784 |
| 4,348,667 | 9/1982 | Williams et al. | 340/753 |
| 4,468,661 | 8/1984 | Van Doorn et al. | 340/754 |
| 4,495,585 | 1/1985 | Buckley | 340/754 |
| 4,570,151 | 2/1986 | Martorano et al. | 340/753 |
| 4,578,640 | 3/1986 | Crooke et al. | 340/731 |
| 4,647,922 | 3/1987 | Saxe | 340/722 |
| 4,690,509 | 9/1987 | Bohmer | 350/333 |

Primary Examiner—David K. Moore
Assistant Examiner—M. Fatahi-yar
Attorney, Agent, or Firm—Gifford, Groh, Sprinkle, Patmore and Anderson

[57] ABSTRACT

An electronic recording and display apparatus for performing the function of a chart recorder comprises a solid state display device controlled from a memory by a display controller. The memory receives signals in the form of 8-bit binary number digitized by a signal digitizer from an analogue input signal. the display device graphically displays a set of the signals stored in the memory and this can be "scrolled" through all the information stored in the memory in a manner similar to a chart recorder.

12 Claims, 2 Drawing Sheets

COMBINED INFORAMTION RECORDING AND GRAPHIC DISPLAY DEVICE

This a continuation of cco-pending application Ser. No. 763,043 filed on August 6, 1985, now abandoned.

BACKGROUND OF THE INVENTION

A combined inforamtion recording and graphic display device is described herein, which is intended to serve electronically the function until now performed by instruments known as "chart recorders".

Chart recorders are used throughout industry to provide a permanent record of a varying electrical signal. Such electrical signal is converted, upon being fed to the recorder, to cause displacement of a chart marking instrument such as a pen, which is displaceable in a line across the chart whilst the chart itself is displaced, perpendicularly with respect to the line of movement of the pen, at a constant rate or incrementally in dependence on the circumstances. The combined effect of the movement of the pen or other marking instrument, which represents the value of the input signal at any instant in time, and the movementof the paper within the chart recorder, produces a varying line constituting a permanent record of the value of the input signal at any instant in the time period recorded by the instrument. Such permanent records may be required for any one of a number of purposes, for example analyzing the past history of variation of a parameter sensed by a suitable sensor and converted into an electrical signal which is supplied to the chart recorder, and may be used for any purpose for analysis, control or prediction.

A major disadvantage with chart recordoers is constituted by the sheer bulk of the paper constituting the record of the signal variations. Indeed, given that the chart marking usually constitutes only a single line on a chart of fixed width the major part of the area of the chart is wasted in the sense that it provides no useful information except to constitute a frame of reference within which the value of the signal can be determined.

If the information contained on the chart is likely to be needed again the whole chart must be stored and the storage problems for such bulky objects rapidly become a major problem. Acess to a given item of information is also difficult since the chart can only be viewed sequentially by "scrolling" through the length of the chart to find a period of interest.

Other disadvantages of known chart recorders are related to their mechanical nature, and therefore the relatively poor response to rapidly fluctuating input signals which limits the high frequency end of the signal spectrum, and to the fact that mechanical disturbances to the recording instrument itself can affect the value of the record thus produced independently of the variations in the input signal thereby introducing another error. Further, the relatively fixed nature of the chart record means that comparison between the signal values at tow widely differing points in time can be effected only with difficulty, either by laying the charts out on a large table and physically moving the regions of interest into juxtaposition, or by effecting measurements of the linear dimensions on the chart and storing these separately thereby, again, introducing potential errors in measurement of the chart itself.

OBJECTS OF THE INVENTION

A primary object of the present invention is to provide a recording and display instrument capable of performing the same functions as are currently performed by chart recorders.

Another object of the present invention is to overcome many of the known disadvantages of chart recorders attributable to the huse of visibly marked paper as the recording medium.

Afurther object of the invention is to provide apparatus which is capable of storing information electronically and displaying it on a screen which can operate to display two or more portions of a signal simultaneously to allow an operator to effect comparisons.

Still a further object of the present invention is to provide a recording and display instrument in which the record of a signal variation over an extended period of time can be stored in a small space avoiding the necessity for large rolls or stacks of paper.

Yet another object of the present invention is to provide an instrument capable of recording and displaying the value of a varying incoming electrical signal utilizing only solid state electronic components which are not subject to the perturbing influences of mechanical vibrations or other environmental disturbances.

SUMMARY OF THE INVENTION

According to the present invention, therefore, an electronic recoding and display apparatus comprises input signal digitizing means operting to digitize the value of incoming electrical input analogue signals varying in value with time, said digitizing means including converter means operating to convert said input signal to pulse form, and integrator means operating to integrate said pulses to produce a digital signal representative of the analogue value of said input signal over a sampling interval; random access memory means operating to store successively generated said digital signals representing said means value of said input signal over said sampling interval at successively addressable storage locations in a predetermined reading pattern in said random access memory means, and a solid state matrix display device operating to display a plurality of successive digitized values of said input signal.

The apparatus of the present invention can be used to provide a graphic display of the manner in which an input signal has varied with time in a preceding time period, the individual digitized signal being displayed in such a manner that the magnitude of the digitized signal is represented as a linear dimension on the display.

A very much greater number of signals than can be displayed at any one time on the display screen can be stored in the memory and, therefore, there are preferably provided means for selecting the set of displayed digitized values from the total set of stored values in the memory. An operator may thus choose to display the set of most recent signals, or any set of signals from a period in the past selected by operating, for example, on a keyboard linked to a microprocessor controlling the apparatus.

In a preferred embodiment of the invention the solid state display device is controlled by the apparatus in such a way as to display each digitized signal as a line on the screen, adjacent digitized signals in a set thereof displayed on the screen being displayed as adjacent lines and the length of each line from a given edge of the display screen representing the magnitude of the digitized signal represented thereby. To further extend the usefulness of the apparatus of the present invention, for example to allow it to provide a permanent record of variation of a signal over a long period, perhaps running into years, there may be further provided permanent storage means, and means for transferring the information from the memory to the said permanent storage means. Any known permanent storage means suitable for storing sets of electrical signals, and which can be "read" to provide a regeneration of the electrical signals may be employed. For this purpose it is envisaged that the permanent storge means may include a magnetic disc, or alternatively, a second solid state memory device may be employed, in which case this is preferaby a programmable read-only memory device. Such a memory device is normally hard wired into the circuit and for the purposes of the present invention it is envisaged that the permanent memory would be provided with releasable connections, for example, in the form of plug and socket contacts such as the edge contacts frequently provided on printed circuit boards to allow the memory to be plugged in for transfer of information, and subsequently removed for storage.

Non-volatile memory devices are required for this purpose and, if necessary, additional electrical supply by battery incorporated into the modular unit may be provided. Likewise, a liquid crystal dot matrix display or an electro luminescent display may be used as the dispaly device.

A graphic display may be generated on such a liquid crystal device by selectively energizing a plurality of individual visually discernible cells or units. Such a matrix may be made as a set of rows and columns defining a matrix of dots each dot being capable of being electrically energized to provide one of two binary, visually distinguishable states. In a reflective cell the sttes represent reflective and non-reflective areas such that incident light falling on the screen is selectively reflected to provide a pattern of light and dark areas which can be visually distinguished by an observed. The data stored in the memory is applied to this display device in such a way that a pattern is built up in a manner representative of that displayed on a conventional paper chart recorder. Additionally, means may be provided for displaying at least some of the information in alphanumeric form and the information displayed may represent the values of all or some of the signal samples displayed in graphic form on the screen, or may represent values derived therefrom or intermediate values in calculations in which the values of the signal are substituted in order, for example, to determine safety margins or operating conditions. For example, the instantaneous values of each sample displayed graphically on the screen may be summed to provide a separate alphanumeric display representing the total integral value of the signal over the time period in question, or alternatively an average value may be generated therefrom to represent the mean value of the signal over the display period. Such a mean value may also be indicated graphically either simultaneously or sequentially with the graphic display of the digitized signals.

The display control means referred to above may also be operable to change the display by sequentially adding one signal to one end of the display and removing a signal from the other end of the display, hifting each individual stored signal one unit along the display screen so that an effective "scrolling" through the stored information is achieved. Since the individual digitized signals are stored in a predetermined address pattern in the memory it is possible for the apparatus automatically to display a band of these signals by following the predetermined address patern.

In addition, the display control means may select a set of values from one location in the memory and another set of values for display from another location in the memory, tthe display screen then being split to allow two setss of values to be displayed at once for comparison purposes. The screen may be split longitudinally or transversely (in relation to the time axis) for this purpose and, indeed, more than two separate sets of signals may be displayed at any one time if comparison between three or more sets of signals is required.

Various other features and advantages of the present invention will become apparent from a study of the following descriptions of a preferred embodiment, in which reference is made to the accompanying drawings, provided purely by way of non-limitative example.

DESCRIPTION OF THE PREFERRED EMBODIMENT

Figure 1:
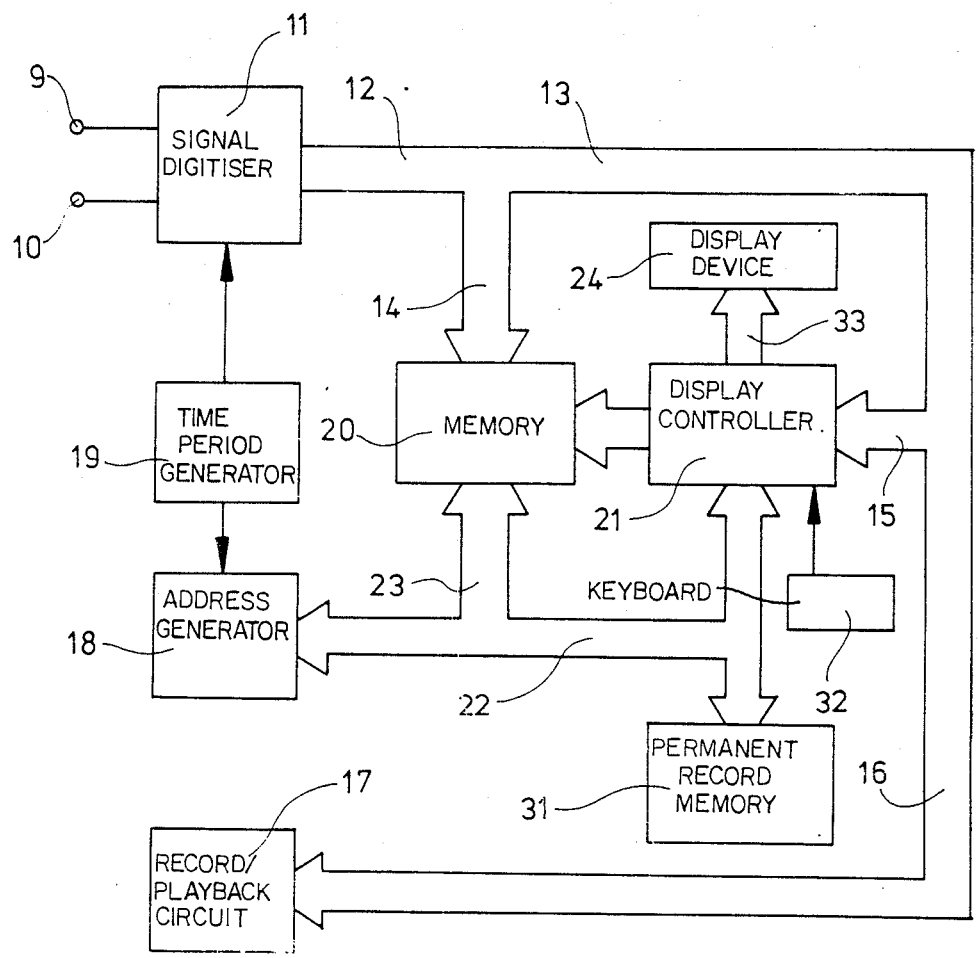
FIG. 1 is a block schematic diagram illustrating a circuit constituting an embodiment of the present invention.

The circuit shown in FIG. 1 has input terminals 9, 10 for receiving an analogue input signal which varies in time. Such signal may, for example, be a voltage signal the value of which varies in dependence on a measured parameter which causes it to vary in time. The nature of the input signal is not, of course, critical to the present invention and adaptation for accepting an electrical signal in which the information is contained in a varying current rather than a varying voltage is equally within the scope of the present invention. Likewise, the source of the signal is unimportant and may come from any type of electrical measuring or signal generating equipment to which a chart recorder may in the past have been attached to provide a display and record of the variations thus manifest.

The voltage signal appearing between the terminals 9, 10 is applied to a signal digitizer 11 which will be described in more detail in relation to FIG. 2. This signal digitizer receives a timing signal from a time period generator 19 and produces an output signal on a data bus 12 in the form of a digital number of binary form. The data bus 12 may, for example, contain eight lines in which case the digital number emitted by the signal digitizer 11 may vary between 0 and 256. Greater discrimination and definition may be achieved by utilizing equipment capable of operating on more than 8-bit digital signals, but for the purposes of the present description it will be assumed that 8-bit digital number may contain the required information with adequate resolution.

The data bus 12 branches into two parts 13, 14 and the latter branch, 14, leads to a memory 20 whilst the former, 13 branches again into a branch 15 and a branch 16 the former of which leads to a display controller 21 and the latter of which leads to a record/play back circuit 17 which also receives control signals from an address generator 18. The address generator 18 is interconnected with the time period generator 19 and is linked by an address bus 22 to the display controller 21 and by a branching address bus 23 to the memory 20. A further branch of the address bus 22 leads to a permanent record memory 31.

The display controller receives input control signals from a keyboard 32 and generates control signals on an output bus 33 leading to a solid state display device 24 which, as mentioned hereinabove, may be an electroluminescent display or a liquid crystal matrix.

Figure 2:
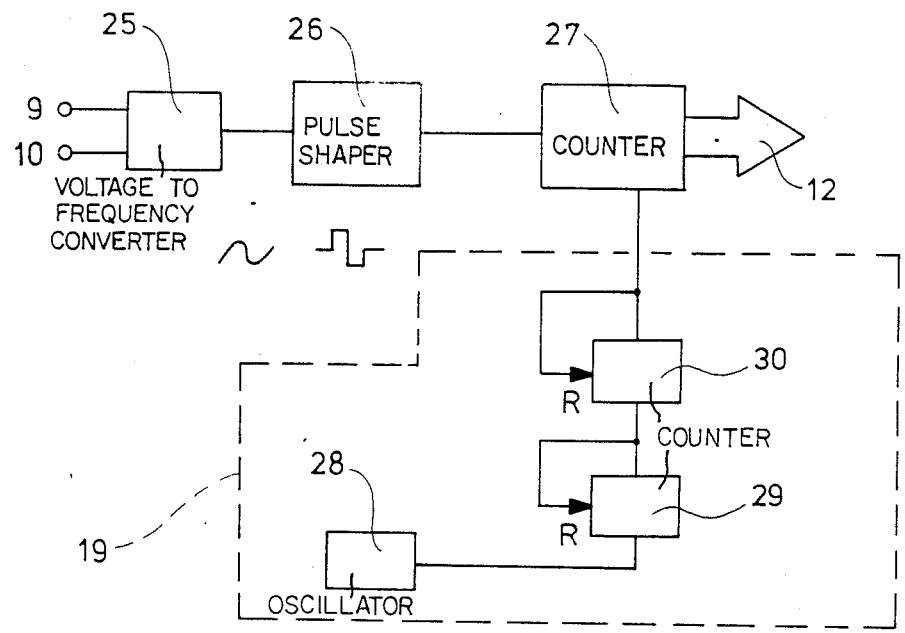
FIG. 2 is a block diagram representing a part of the circuit of FIG. 1.

In FIG. 2, there is shown the means for digitization of the signal appearing across the terminals 9, 10. The input signal is an analogue voltage which is fed to a voltage-to-frequency converter 25 which, produces a frequency signal at the output thereof, which signal varies in frequency in dependence on the magnitude of the input voltage signal. The varying frequency signal from the voltage-to-frequency converter 25 is supplied to a pulse shaper 26 which, by any of the known means, (such as infinite clipping or saturation amplifying) produces a square pulse wave from at its output at the same frequency as the wave form at the input. The square pulses from the pulse shaper 26 are then supplied to a counter 27 which counts for a time period determined by the period genereator 19 which, as shown in FIG. 2, is itself consituted by an oscillator 28, a first counter 29 the output of which is connected to a second counter 30 and to its own reset input, the output of the counter 30 being connected to its own reset input and to the reset terminal of the counter 27. The oscillator 28 generatesa fixed frequency signal which is, in effect, divided down by the counters 29 and 30 to produce an output signal at a fixed period which depends on the required sampling time. This sampling time may be any suitable time period for the purposes to which the recording instrument of the present invention is put and may vary from merly seconds in some situations to minutes, hours or even weeks in others.

In the present description the period of the sampling time will be assumed to be one minute. The counter 27 will thus produce an output to the data bus 12 representing the number of input pulses which it has counted during the preceding minute and is then reset by the time period generator 19 which latter then commences to time the next one minute period. The output from the counter 27 is in the form of an 8-bit binary number supplied to the memory 20 and stored there in an address determined by the address generator 18 which is also controlled by the time period generator 19 so that each individual 8-bit number arriving on the branch 14 of the data bus 12 is directed to an individual separate address by the address generator 18 until the memory 20 is full. When this happens the future operation of the circuit depends on the program in the display controller 21. If a long term store of the information is not required the address generator 18 may merely cycle through the address locations in the memory 20, starting again with the first address location when the last has been filled so that the device only contains information pertinent to a fixed preceding time period and is continually updated.

Alternatively, if a permanent record is required, the display controller 21 detects when the last memory location is filled in the memory 20 and triggers the record/playback circuit 17 to cause the memory 20 to unload its contents into a permanent record 31. As explained above this permanent record may be in the form of a magnetic disc of known type, a magnetic tape or a programmable read-only memory. In the case of the programmable memory this is held in a casing having releasable terminals such as plug and socket connections enabling it to be removed easily for storage and replaced by a similar memory for storing the next set of signals.

Figure 3:
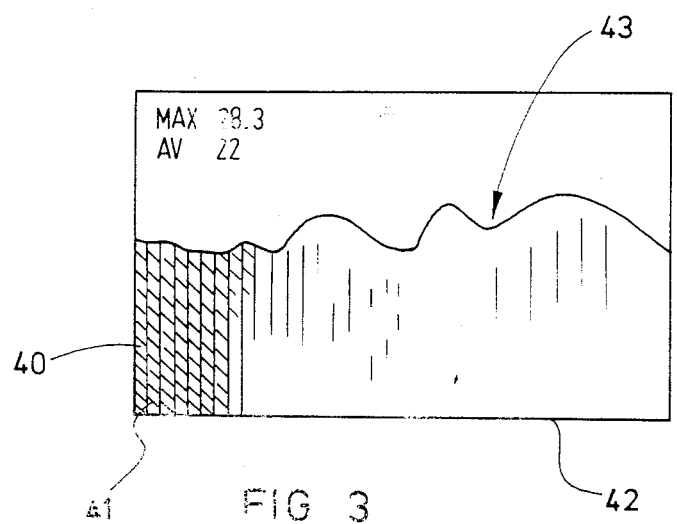
FIG. 3 is a face view of a screen of a display device forming part of the embodiment of FIG. 1.

The display on the display device 24 is representative of a fixed size set of signals within the memory, and represents a "field of view" determined by the maximum number of matrix elements from which such a display device may be made. The physical dimensions of the apparatus and the required resolution of the signal will also determine the number of individual digitized signals which may be displayed on the screen. FIG. 3 illustrates the format in which the screen image appears, this representing a plurality of dark columns 40, 41 etc., the length of which from the edge 42 of the screen represents the position of a line 43 constituting an indication of variation in the value of the incoming signal applied to the terminals 9, 10. In addition, on the screen, alphanumeric representation of selected signals and calculations made from the values of these signals may be displayed. In FIG. 3 the alphanumeric display represents the maximum value, that is the value of greatest signal displayed, and the "average" value of the signals displayed. It will be apparent to those skilled in the art how other alphanumeric signals representative of any desired combination of the stored signals or calculations based on the values of these stored signals may be made.

What is claimed is:

1. Electronic recording and display apparatus for receiving, recording and displaying the value of an analogue electrical input signal applied to an input terminal of said apparatus, said apparatus comprising:

time period generator means including an oscillator operating to produce a pulse signal having a constant given pulse repetition frequency, and first count means connected to said oscillator and operating to count the pulses of said given pulse repetition frequency and to produce an output after a given count thereby acting in effect as a frequency divider whereby to determine a given sampling interval;

input signal digitizing means receiving said analogue electrical input signal and operating to convert the analogue incoming electrical input signal to a binary digital signal representative of the means value of said input signal over said sampling interval;

random access memory means operating to store said digitized values at successively addressable storage locations thereof;

address generator means operating to generate signals representing a sequential series of adrress locations in said random access memory means whereby to store successively generated said binary digital signals representing said mean value of said input signal over said sampling interval at successively addressable storage locations in a predetermined reading patter in said random access memory means;

a solid state matrix display device operating to display a plurality of successive said binary digital signals stored in said random access memory meaans in a pseudo-analogue display pattern composed of a plurality of individual digitally controlled display elements; and operator controllable display control means connected to said random access memory means and to said solid state matrix display device, and operating to select any desired set of digital signals stored in said random access memory for display by said solid state matrix display device;

said solid state matrix display device operating to display the individual values of said selected set of stored digital signals in graphic form as an emulation of a chart recorder.

2. The electronic recording and display apparatus of claim 1, wherein said solid state display device operates to display each said digital signal as a line on said screen of said display, adjacent said digital signals in a set thereof displayed on said screen being displayed as adjacent lines with the length of each said line from a given edge of said display screen representing the magnitude of each digital signal represented thereby.

3. The electronic recording and display apparatus of claim 1, wherein there are further provided permanent storage means and means for transferring the information from said memory means to said permanent storage means.

4. The electronic recording and display apparatus of claim 3, wherein said permanent storage means comprise one of a magnetic tape, a magnetic drum and a programmable read-only memory device.

5. The electronic recording and display apparatus of claim 1, wherein said solid state display device is one of a liquid crystal matrix display, and an electro-luminiscent display.

6. The electronic recording and display apparatus of claim 1, comprising control means operating to change the set of said displayed digital signals by one member of the said set so as to include the signal stored in the adjacent address location in said memory means after each said set of digital signals has been displayed for a predetermined time.

7. The electronic recording and display apparatus of claim 6, wherein said display control means operates to display two or more said sets of said digital signals selected from the digital signals stored at different address locations in said memory means.

8. The electronic recording and display apparatus of claim 6, wherein said display control means is further selectively operable to cause said display device to display data representing the numerical value of a said digitized input signal in the form of alphanumeric charaters.

9. The electronic recording and display apparatus of claim 6, wherein said display control means includes means for selectively displaying data in alphanumeric form;

said data representing the numerical value of signals derived from calculation based on said digital signals.

10. The electronic recording and display apparatus of claim 4, wherein said permanent storage means comprises a solid state memory device provided with releasable electrical terminals whereby said memory device can be removed and replaced periodically so as to provide a separate permanent record of the data over a given recording time period.

11. The electronic recording and display apparatus of claim 1, wherein said input signal digitizing means includes:

voltage-to-frequency converter means operating to convert said input signal into pulses; and second counter means operating to count said pulses over said given sampling interval determined by said first counter means whereby to produce said binary digital signal.

12. Electronic recording and display apparatus comprising an input circuit for receiving input signals, integrator means connected to said input circuit and operating to integrate said input signals whereby to produce an output digital signal therefrom, memory means connected to said integrator means, said memory means operating to store said digital signals upon generation thereof by said integrator means, address genertor means connected to said memory means, said address generator means operating to generate signals for determining the addresses at which said digital signals are stored in said memory means;

display control means connected to said memory means, and solid state matrix display means connected to said display control means so as to be controlled thereby and operating to display on a screen thereof a sequential set of said stored digital signals selected by said display control means, with each digital signal being represented as one of a line and a point on said display screen whereby to provide a graphic display of said sequential set of said stored digital signals.

* * * * *